(12) United States Patent
Xu et al.

(10) Patent No.: US 8,723,612 B2
(45) Date of Patent: May 13, 2014

(54) TRIMMING CIRCUIT FOR CLOCK SOURCE

(75) Inventors: Xiuqiang Xu, Suzhou (CN); Jie Jin, Suzhou (CN); Yizhong Zhang, Suzhou (CN)

(73) Assignee: Freescale Semiconductor, Inc., Austin, TX (US)

(*) Notice: Subject to any disclaimer, the term of this patent is extended or adjusted under 35 U.S.C. 154(b) by 128 days.

(21) Appl. No.: 13/607,734

(22) Filed: Sep. 9, 2012

(65) Prior Publication Data
US 2013/0285729 A1    Oct. 31, 2013

(30) Foreign Application Priority Data

Apr. 25, 2012 (CN) .......................... 2012 1 0182560

(51) Int. Cl.
*H03K 3/0231* (2006.01)
*H03K 4/502* (2006.01)

(52) U.S. Cl.
CPC ...... *H03K 3/0231* (2013.01); *H03B 2201/0266* (2013.01); *H03K 4/502* (2013.01)
USPC ............... 331/179; 331/11; 331/143; 334/55; 327/404

(58) Field of Classification Search
CPC ....... H03K 3/0231; H03K 3/354; H03K 4/08; H03K 4/50; H03K 4/501; H03K 4/502; H03B 2201/025; H03B 2201/0266; H03B 5/1265; H03J 5/0245
USPC ....... 331/111, 143, 179, 36 C, 177 V; 334/47, 334/55; 327/403, 404
See application file for complete search history.

(56) References Cited

U.S. PATENT DOCUMENTS

| | | | |
|---|---|---|---|
| 5,327,404 A | 7/1994 | Nolan | |
| 6,317,069 B1 | 11/2001 | Male | |
| 6,927,624 B2 | 8/2005 | Ivanov | |
| 7,005,933 B1 | 2/2006 | Shutt | |
| 7,123,105 B2 * | 10/2006 | Kim et al. | 331/66 |
| 7,319,346 B2 | 1/2008 | Shyr | |
| 7,385,453 B2 * | 6/2008 | Nervegna | 331/176 |
| 7,956,679 B2 | 6/2011 | Kimura | |
| 8,542,073 B2 * | 9/2013 | Matsuzaki et al. | 331/111 |
| 2007/0247237 A1 * | 10/2007 | Mohammadi | 331/36 C |
| 2009/0021332 A1 * | 1/2009 | Brekelmans et al. | 334/55 |
| 2009/0072804 A1 | 3/2009 | Hirota | |
| 2011/0025419 A1 | 2/2011 | Kimura | |

* cited by examiner

*Primary Examiner* — Ryan Johnson
(74) *Attorney, Agent, or Firm* — Charles Bergere

(57) ABSTRACT

A semiconductor trimming circuit includes parallel coupled PMOS devices coupled in parallel with parallel coupled NMOS devices and an additional pair of dummy NMOS devices. The dummy NMOS devices are coupled in parallel with the NMOS devices. A trimming circuit for an internal clock source may be formed with an array of such switches for selecting one or more trimming capacitors of the trimming circuit. Such an array has a low leakage current and permits good trimming linearity.

12 Claims, 4 Drawing Sheets

TRIMMING CIRCUIT FOR CLOCK SOURCE

BACKGROUND OF THE INVENTION

The present invention relates to semiconductor devices and, more particularly to semiconductor switches suitable for use in trimming circuits, especially for frequency trimming of an internal clock source such as a relaxation oscillator.

One known relaxation oscillator circuit is described in U.S. Pat. No. 7,005,933. The electrical current, which is passed through a capacitor, creates a capacitor voltage, which is a ramp voltage. A comparator compares a known reference voltage with the ramp voltage and when the two are equal, the comparator switches, creating a clock signal. For effective operation of the oscillator, the circuit must have capacitors of the proper specification for creating the capacitor voltage.

Capacitors often vary in their characteristics due to the fabrication process. This variation can be compensated for by employing digitally-controlled trimmable components. These trimmable components are current sources operating together to produce a summed current, which is used to control the value of a total current that is fed to the capacitor for generating the capacitor voltage and thereby compensate for any process variation in the capacitors.

One example of a trimming circuit is described in U.S. Patent Publication No. 2009/0072804. This trimming circuit supplies a trimmed voltage. The trimmed voltage is generated from an external voltage by selectively switching in or out one or more of a plurality of resistors using a plurality of switches that are formed of P-N paired transfer gates. The switches are controlled by a decoder.

Another example of a circuit with a voltage trimming is described in U.S. Pat. No. 7,956,679, which also uses paired transistor switches. Each switch is controlled by a trim bit of a binary trim code. A certain number of transistors can be switched depending on the particular trim code applied to the transistor gates. U.S. Pat. No. 6,317,069 describes a binary-weighted transistor array of MOS devices. The devices provide a switching function and are enabled at any given time depending on the value of an associated binary bit input.

Semiconductor technology has evolved to using sub-micron geometries down to 90 nm or less. This technology allows integration of complex functionality into smaller areas and further, the use of sub-micron devices provides faster switching times. However, because of their smaller transistor channel lengths, current continues to flow even in the standby (non-switching) state, due to sub-threshold conduction. This conduction leads to current leakage. For low voltage threshold (LVT) devices in particular, drain current is significant even when the device is not enabled. Significant drain current leads to significant current leakage. When LVT devices are used in trimming switches for an internal clock source (such as the relaxation oscillator described above), current leakage can seriously affect the accuracy of the clock.

Internal clock sources require a trimming code with a linear relation if the trimming is to be effective and accurate. Thus, it would be advantageous to have a trimming circuit that can linearly trim the frequency of an internal clock source.

BRIEF DESCRIPTION OF THE DRAWINGS

A more complete understanding of the subject matter may be derived by referring to the detailed description and claims when considered in conjunction with the following figures wherein the reference numerals refer to similar elements throughout the claims.

DETAILED DESCRIPTION OF PREFERRED EMBODIMENTS

Figure 1:
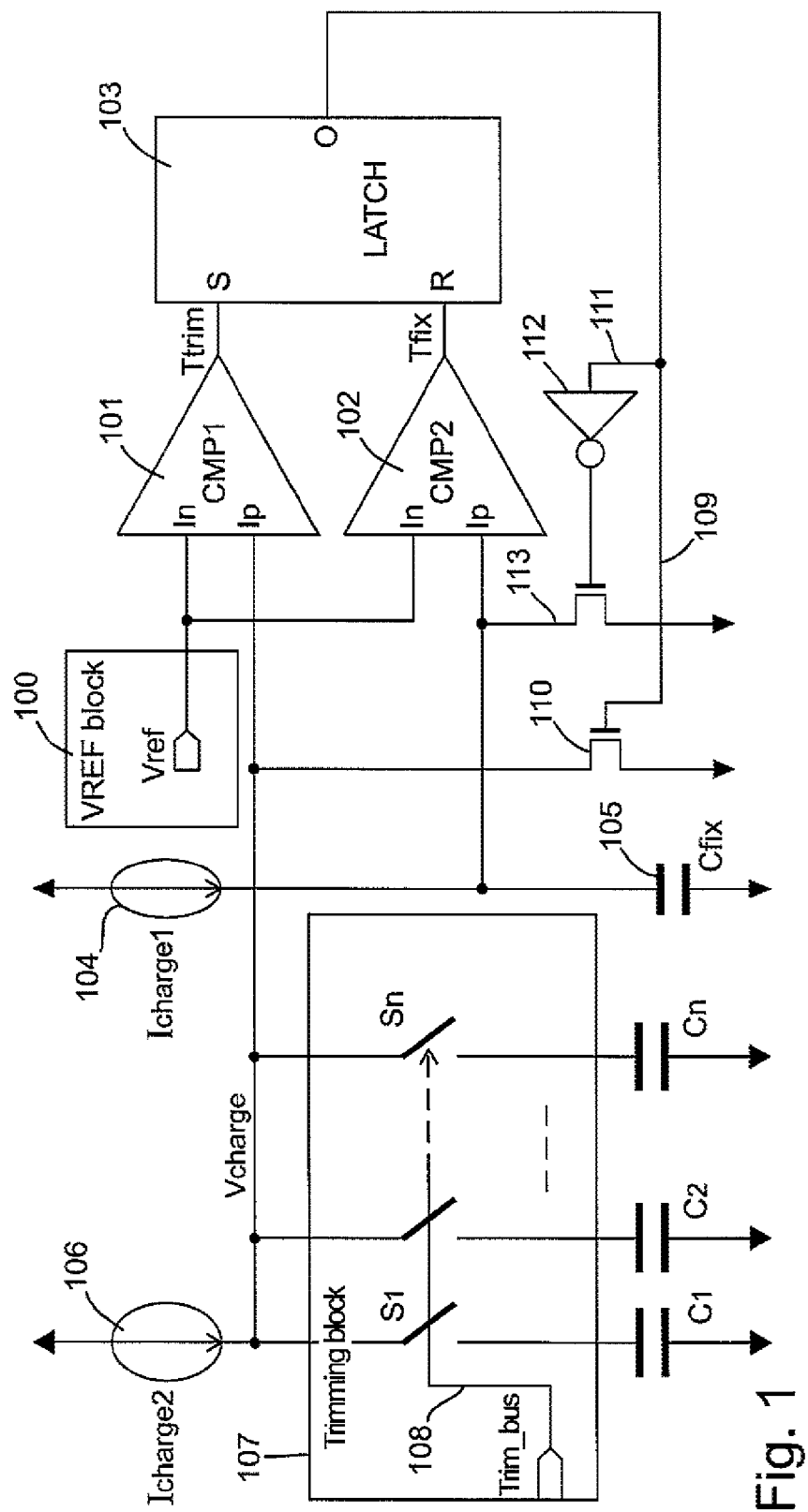
FIG. 1 is a schematic circuit diagram of an internal clock source that may incorporate trimming switches in accordance with an embodiment of the invention.

The following detailed description is merely illustrative in nature and is not intended to limit the embodiments of the subject matter or the application and uses of such embodiments. As used herein, the word "exemplary" means serving as an example, instance or illustration. Any implementation described herein as exemplary is not necessarily to be construed as preferred or advantageous over the implementations. Furthermore, there is no intention to be bound by any expressed or implied theory presented in the preceding technical field, background or following descriptions.

The following description refers to electrical circuit elements being "connected" or "coupled" together. As used herein the words "connected" and "coupled" both mean that one element is joined to "or communicates with" another element and not necessarily mechanically. Thus, although the schematics shown in the figures depict one exemplary arrangement of elements, additional intervening elements, devices, features or components may be present in an embodiment of the depicted subject matter.

For the sake of brevity, conventional techniques relating to functional aspects of the systems may not be described in detail herein. Furthermore, the connecting lines shown in the various figures contained herein are intended to present exemplary functional relationships and/or physical couplings between the various elements. It should be noted that many alternative or additional functional relationships or physical connections may be present in an embodiment of the subject matter. In addition, certain terminology may be used in the following description for the purposes of reference only and they are not intended to be limiting, and the terms first and second and other such numerical terms referring to structures do not imply a sequence or order unless clearly indicated by context.

In accordance with one aspect of the invention, there is provided a semiconductor switch comprising at least one PMOS device coupled in parallel with at least one NMOS device. One or more of such switches may be arranged to form a trimming switch array. Each switch in the array is controllable by a bit of a trimming code. Preferably, the PMOS devices comprising the switches of an array are binary-weighted such that the number of PMOS devices in the switch controlled by trim bit "0" is one (1), the number of PMOS devices in the switch controlled by trim bit "1" is two (2), by trim bit "2" is four (4), by trim bit "3" is eight (8) and so on.

Preferably, the NMOS devices in the array that perform a switching function are not binary-weighted. In one embodiment, the switch controlled by trim bit "0" comprises one (1) switching NMOS device and the switches controlled by all other trim bits comprise two (2) switching NMOS devices. So, for example, for an array of nine (9) switches (controlled by 9 trim bits) the number of switching NMOS devices is thus reduced from 511 (if binary-weighting applied) to 17.

Reducing the number of switching NMOS devices in a trimming switch array significantly reduces current leakage as it has been found that it is the NMOS devices, rather than the PMOS devices, which are the main contributors to this leakage current. Specifically ROFF (off resistance) leakage performance is considerably improved by reducing the number of NMOS devices.

In some embodiments, dummy NMOS devices may be connected across the switching NMOS devices. These dummy NMOS devices may comprise a pair of one or more NMOS devices. The number of devices in each pair depends on how they are arranged in a trimming switch array. The dummy NMOS devices are used to remove the effect of the non-binary-weighted parasitic capacitance of the switching NMOS devices. This measure preserves trimming linearity.

Preferably, the switching NMOS devices are set to the off-state in operation. This means that the on resistance (RON) of a switch will be binary-weighted, even though the switching NMOS devices are not. Also, preferably, high voltage threshold rather than low voltage threshold NMOS devices are used in the trimming switch to further reduce current leakage.

The present invention provides linear capacitance, resistance or charge current trimming with very small current leakage and even at high operating temperatures. This is ideal for trimming the frequency of an internal clock source. Also, these advantages can be achieved without increasing the size of a trimming switch block.

In accordance with a further aspect of the invention, a trimming switch comprises $2^N$ PMOS devices coupled in parallel with two switching NMOS devices, which in turn are coupled with a pair of dummy NMOS devices, each pair comprising $2^{N-1}-1$ NMOS devices where N is an integer equal to or greater than 2.

Referring now to FIG. 1 an internal clock source suitable for use in a microcontroller, for example, is shown. A voltage reference block 100 is connected to a first input of first and second comparators 101 and 102 respectively, and provides a reference voltage Vref at these two inputs. The outputs of the first and second comparators 101, 102 are connected to the S and R inputs, respectively, of a latch 103.

A first current source 104 is linked to a capacitor 105 of a fixed value, $C_{fix}$ and to the second input of the second comparator 102. The output of the second comparator provides a fix value $T_{fix}$, which is input to the R (reset) input of the latch 103. A second current source 106 is linked to the second input of the first comparator 101 and to an array of trimming capacitors, $C_1$ to $C_n$, by way of a trimming block 107. The trimming block 107 incorporates an array of trimming switches $S_1$ to $S_n$. The trimming block 107 also incorporates a trimming bus 108 that carries an externally generated trimming code. Typically, the trimming bus is controlled, in a conventional manner, by registers (not shown). Each of the switches $S_1$ to $S_n$ receives one particular bit of the trimming code. The output of the first comparator 101 provides a trim value $T_{trim}$, which is input to the S (set) input of the latch 103.

An output of the latch 103 is connected by a first line 109 to the gate of a first FET 110 whose drain is connected to the second current source 106. The output of the latch 103 also is connected to an inverter 112 by a second line 111. The output of the inverter 112 is connected to the gate of a second FET 113 whose drain is connected to the first current source 104.

The internal clock source of FIG. 1 operates in a conventional manner to generate a clock signal. That is, the output of the latch 103 changes state whenever the voltages at both inputs on one or the other of the two comparators are equal. The period, T, of the clock signal is dependent on the values of the capacitors such that $T = T_{fix} + T_{trim}$ where $T_{fix} = C_{fix} \cdot V_{ref}/I_{charge1}$ and $T_{trim} = C_{trim} \cdot V_{ref}/I_{charge2}$ The $C_{trim}$ value is set by switching in one or more of the trimming capacitors $C_1$-$C_n$. This switching is performed by the relevant one or more of the switches $S_1$ to $S_n$ which in turn, are controlled by the trimming bits of the trimming code.

Figure 2:
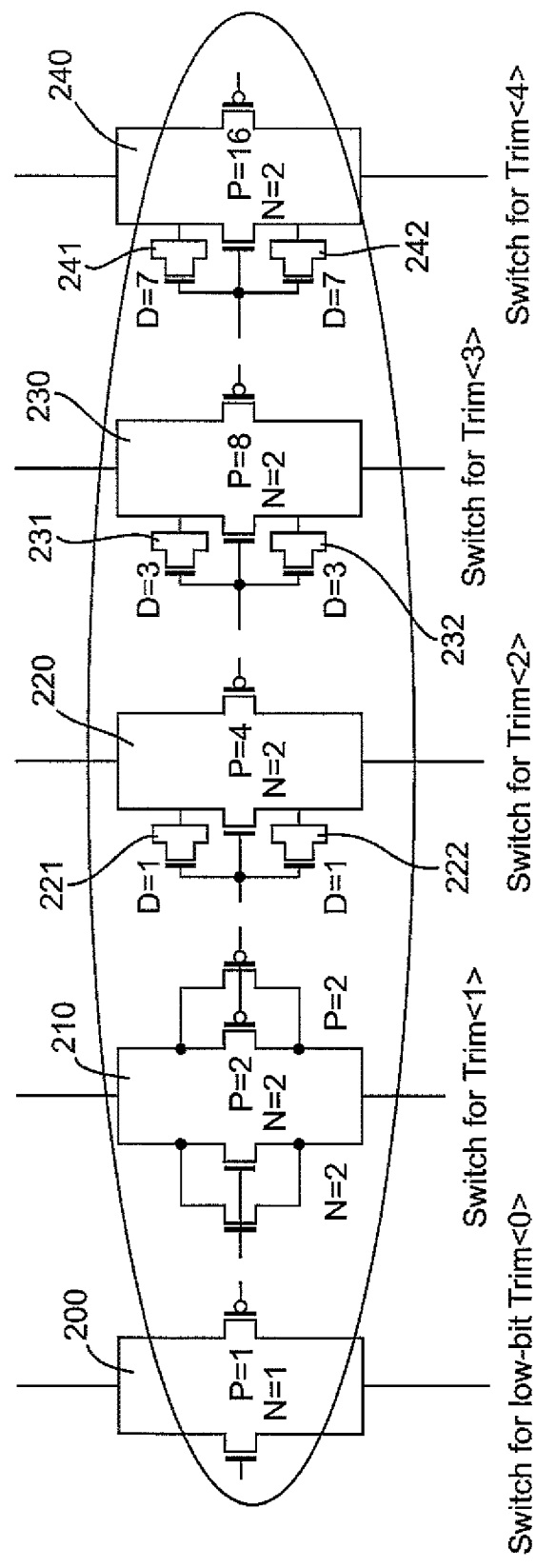
FIGS. 2, 3 and 4 are schematic diagrams of a plurality of trimming switches in accordance with the invention and arranged in an array.

FIG. 2 shows an array of five switches 200, 210, 220, 230, 240 that may be incorporated in the trimming block 107 of FIG. 1 to perform the switching function of the trimming switches $S_1$ to $S_n$. Each of the switches 200, 210, 220, 230, 240 comprises at least one PMOS device coupled in parallel to at least one NMOS device. The coupling of NMOS to PMOS comprises source-to-source connections and drain-to-drain connections. The gates of the devices are connected to the trim bus as will be described below.

The first switch 200 is controlled by the least significant bit (LSB) of the trim code carried by the trim bus 108 (FIG. 1), i.e., trim bit "0". The first switch 200 has just one PMOS and one NMOS device. In the figures, "P" denotes the number of PMOS devices connected in parallel with each other, "N" denotes the number of NMOS devices connected in parallel with each other, and "D" denotes the number of dummy NMOS devices connected in parallel with each other. As shown in FIG. 2, for the first switch N and P both equal 1, thus there is one NMOS device and one PMOS device and these two devices are connected in parallel (source to source and drain to drain connections) and their gates are connected to the trim bus 108 (FIG. 1). The second switch 210 is controlled by the next bit, trim bit "1". For the second switch 210, N=P=2 so the second switch 210 comprises two NMOS devices and two PMOS devices. The "N" NMOS devices are connected to each other in parallel and the "P" PMOS devices are connected to each other in parallel. That is, for the "N" NMOS devices, their gates, sources and drains are respectively connected together, and for the "P" PMOS devices, their gates, sources and drains are connected together. Then, the NMOS devices are connected in parallel with the PMOS devices so the sources and drains of the NMOS devices are connected to the sources and drains of the PMOS devices. The gates of the NMOS and PMOS devices also are connected to the trim bus 108.

The third switch 220 is controlled by trim bit "2" and comprises four PMOS devices (P=4) coupled in parallel with two NMOS devices (N=2). The two NMOS devices are, in turn, coupled to a pair of upper and lower dummy NMOS devices 221, 222 (D=1). The pair of dummy NMOS devices 221, 222 has their gates connected to the gates of the NMOS devices. The upper NMOS device 221 has its drain and source connected to the sources of the NMOS devices. The lower dummy NMOS device 222 has its drain and source connected to the drains of the NMOS devices.

The fourth switch 230 is controlled by trim bit "3". It comprises eight PMOS devices (P=8) coupled in parallel with two NMOS devices (N=2). In a similar fashion to switch 220, there also are coupled across the NMOS devices a pair of dummy NMOS devices 231, 232. However, in contrast with third switch 220, each of the pair of the dummy NMOS devices 231, 232 comprises three parallel connected NMOS devices (D=3).

The fifth switch 240 is controlled by the fifth and most significant trim bit denoted as trim but "4". The fifth switch 240 comprises 16 PMOS devices (P=16) coupled in parallel with two NMOS devices (N=2). In a similar fashion to switches 220 and 230, it incorporates a pair of dummy NMOS devices. In contrast with the third and fourth switches 220 and 230 however, each pair of the dummy NMOS devices has D=7, i.e. 7 NMOS devices each. The "D" NMOS devices in each dummy pair are all connected together in parallel.

Figure 3:
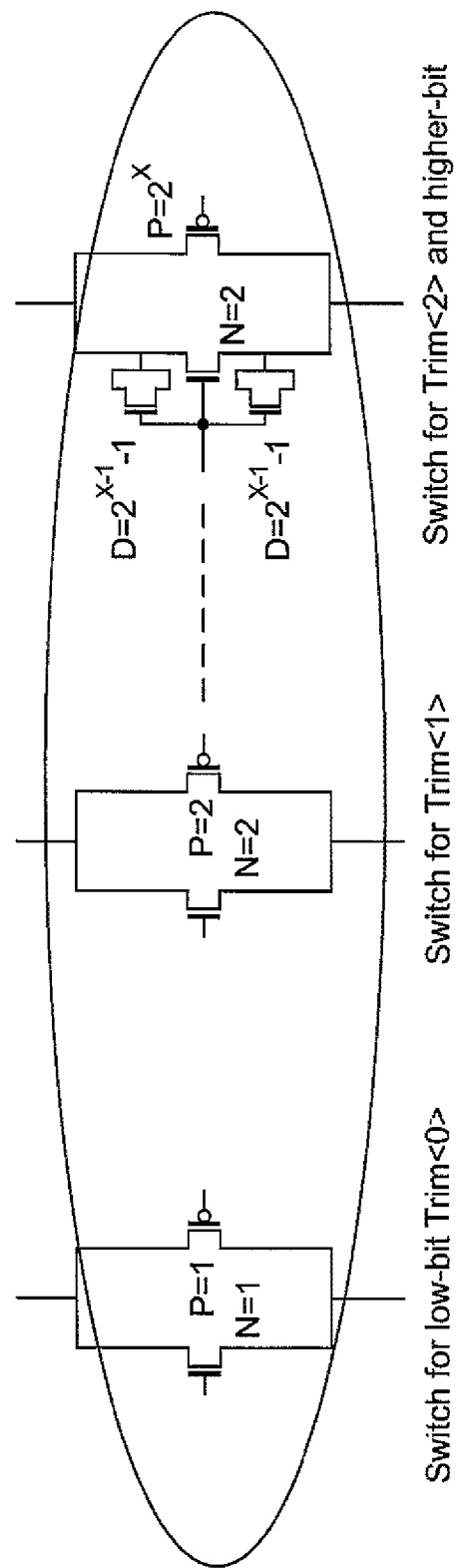

It will be apparent that the PMOS devices are binary-weighted but the NMOS devices are not. The general configuration is illustrated in FIG. 3. The number, P, of PMOS devices incorporated in any switch is given by the relation $P=2^X$ where X is the number of the trim bit that is applied to that particular switch with the least significant bit being equal to 0. The number N of NMOS devices in a switch is 1 for trim bit 0 and 2 for all subsequent values of trim bits. The number D of NMOS devices included in each pair of dummy NMOS devices is $D=2^{X-1}$ but only the switches controlled by trim bits 2 and higher incorporate the pairs of dummy NMOS devices.

Figure 4:
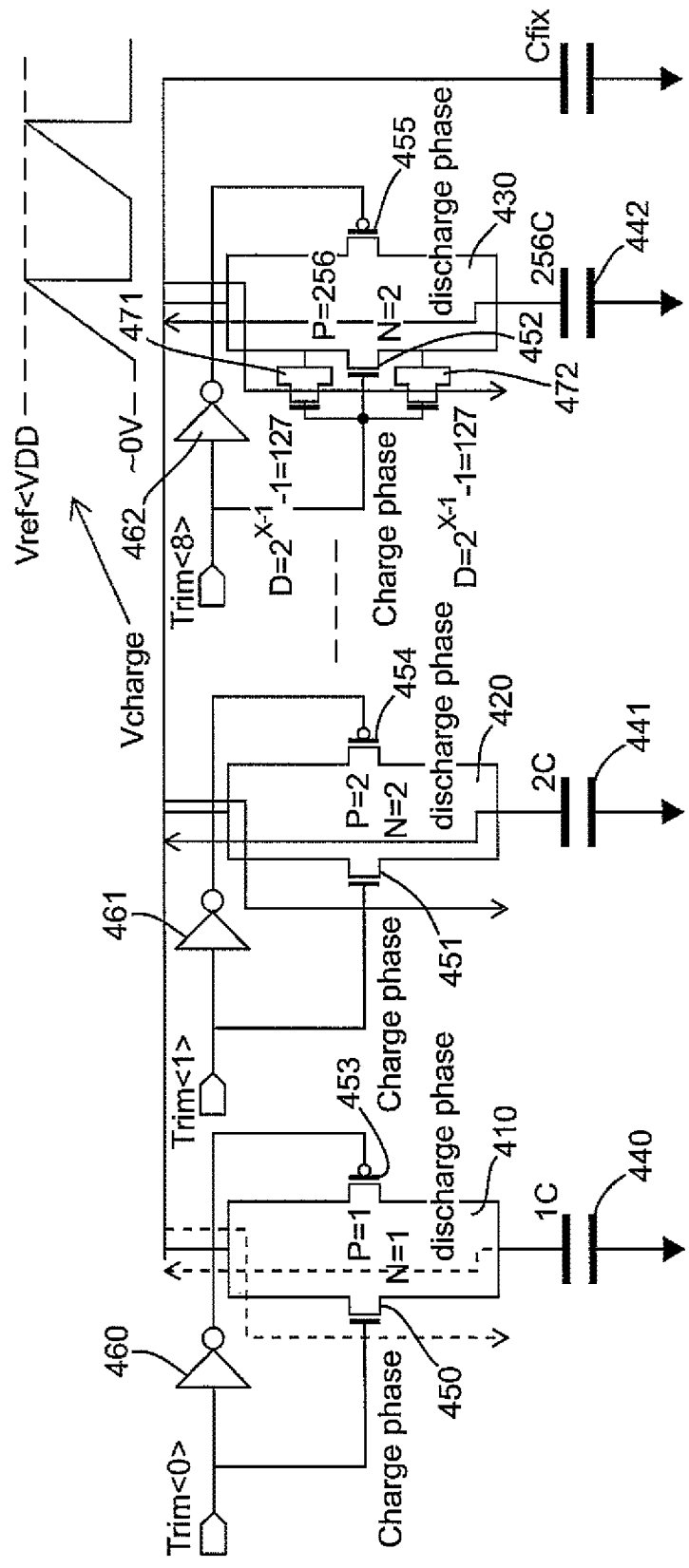

FIG. 4 illustrates an exemplary trimming switch array, similar to that shown in FIGS. 2 and 3, for trim bits 0 to 8 but only the LSB, next to LSB and MSB switches are shown for the sake of clarity. The drain connections on each of the switches 410, 420, 430 are each connected to a respective trimming capacitor 440, 441, 442. The capacitors are binary-weighted. The gates of the NMOS devices 450, 451, 452 are connected respectively to the least significant trimming bit, the next least significant trimming bit and the most significant trimming bit respectively. The gates of the PMOS devices 453, 454, 455 are connected via inverters 460, 461, 462 also to the respective trimming bits (LSB to MSB). The sources of each of the switches 410, 420, 430 are each connected together and thence to a charging current source (not shown). Pairs of dummy NMOS devices 471, 472, are incorporated into switches controlled by trim bits "2" and higher. The switch 430 controlled by trim bit "8" has 127 NMOS devices in each dummy pair 471, 472.

When any particular trim bit is a logical "1", the switch 450, 451, 452 that particular bit controls will turn on (conduct). That is to say, the gates of the NMOS devices are driven to high and, by virtue of the inverters, 460, 461, 462, the gates of the PMOS devices are driven to low.

The voltage reference block 100 (FIG. 1) which provides a reference voltage for each comparator 101, 102 is set to a value, VREF, which complies with the relationship:

$$VREF > VDD - VTHN$$

Under the above condition, when the voltage is charged to VREF, the NMOS devices in the switches are in the OFF state. So in this condition the ON resistance (RON) of each switch is only dependent on the PMOS devices. Under the condition where:

$$VTHP < VREF \ll VDD,$$

the leakage of the PMOS devices is very small due to the substrate bias effect. Thus, the trimming circuit of the present invention has a very low leakage current.

In the foregoing specification, the invention has been described with reference to specific examples of embodiments. It will, however, be evident that various modifications and changes may be made therein without departing from the broader spirit and scope of the invention as set forth in the appended claims. Other modifications, variations and alternatives are also possible. The specification and drawings are, accordingly, to be regarded in an illustrative rather than a restrictive sense.

The invention claimed is:

1. A trimming circuit for a clock source, comprising:
   a plurality of switches, wherein each switch is controlled by a bit of a trimming signal;
   a plurality of trimming capacitors respectively connected in series with the plurality of switches,
   wherein the plurality of switches comprises,
   a first switch including a PMOS device connected in parallel with an NMOS device, wherein a least significant bit of the trimming signal is connected to the gates of the PMOS and NMOS devices,
   a second switch including two PMOS devices connected in parallel with each other, and two NMOS devices connected in parallel with each other, wherein the two PMOS devices are connected in parallel with the two NMOS devices, and wherein a second bit of the trimming signal is connected to the gates of the two PMOS devices and the two NMOS devices; and
   a third switch including two NMOS devices connected in parallel with each other, and four PMOS devices connected in parallel with each, wherein the two NMOS devices are connected in parallel with the four PMOS devices, wherein a third bit of the trimming signal is connected to the gates of the two NMOS devices and the four PMOS devices.

2. The trimming circuit of claim 1, further comprising an inverter connected between an input of the trimming signal and the gates of the PMOS devices.

3. The trimming circuit of claim 1, further comprising a pair of dummy NMOS devices connected to the NMOS devices of the third switch, wherein each of the dummy NMOS devices has a gate connected to the gates of the two NMOS devices of the third switch.

4. The trimming circuit of claim 3, further comprising one or more additional switches, each controllable by an additional respective bit of the trimming signal, wherein each additional switch comprises $2^N$ PMOS devices coupled in parallel with two switching NMOS devices that are, in turn coupled with a pair of dummy NMOS devices, each of said pair comprising $2^{N-1}-1$ NMOS devices, where N is the number of the trim bit controlling said each additional switch.

5. The trimming circuit of claim 1, wherein said NMOS devices are high voltage threshold devices.

6. A trimming switch array for providing a trim signal to a clock source, the trimming switch array comprising:
   at least three switches wherein each switch is controllable by a bit of a binary trimming code comprising at least three bits, "0", "1", "2" wherein a first of said at least three switches is controllable by bit "0" of the binary trimming code, and wherein each switch comprises one PMOS device coupled in parallel with one switching NMOS device, a second of said at least three switches being controllable by bit "1" of the binary trimming code and comprising two PMOS devices coupled in parallel with two switching NMOS devices, and a third of said at least three switches being controllable by bit "2" of the binary trimming code and comprising four PMOS devices coupled in parallel with two NMOS switching devices which are, in turn, coupled with a pair of dummy NMOS devices.

7. The trimming switch array of claim 6, further comprising one or more additional switches, each controllable by an additional bits "3" and upwards of the trimming code, wherein each additional switch comprises $2^N$ PMOS devices coupled in parallel with two switching NMOS devices that are, in turn coupled with a pair of dummy NMOS devices, each of said pair comprising $2^{N-1}-1$ NMOS devices, where N is the number of the trim bit controlling said each additional switch.

8. The trimming switch array of claim 7, wherein the NMOS devices comprise high voltage threshold devices.

9. A clock source for a semiconductor integrated circuit, the clock source comprising:
   a voltage generator for generating a reference voltage;

first and second current sources for generating respective first and second charge currents;

a first comparator having a first input that receives the reference voltage, a second input that receives the second charge current, and an output that provides a trimming signal;

a second comparator having a first input that receives the reference voltage, a second input that receives the first charge current, and an output that provides a trim fix signal;

a latch having a first input that receives the trimming signal, a second input that receives the trim fix signal, and an output that provides a clock signal;

a plurality of trimming capacitors having first terminals connected to the second current source and the second input of the first comparator; and a trimming switching array connected between the second current source and the plurality of trimming capacitors, wherein the trimming switching array comprises, at least three switches wherein each switch is controllable by a bit of a binary trimming code comprising at least three bits, "0", "1", "2" wherein a first of said at least three switches is controllable by bit "0" of the binary trimming code, and wherein each switch comprises one PMOS device coupled in parallel with one switching NMOS device, a second of said at least three switches being controllable by bit "1" of the binary trimming code and comprising two PMOS devices coupled in parallel with two switching NMOS devices, and a third of said at least three switches being controllable by bit "2" of the binary trimming code and comprising four PMOS devices coupled in parallel with two NMOS switching devices which are, in turn, coupled with a pair of dummy NMOS devices.

10. The clock source of claim 9, wherein the trimming switch array further comprises one or more additional switches, each controllable by an additional bits "3" and upwards of the trimming code, wherein each additional switch comprises $2^N$ PMOS devices coupled in parallel with two switching NMOS devices that are, in turn coupled with a pair of dummy NMOS devices, each of said pair comprising $2^{N-1}-1$ NMOS devices, where N is the number of the trim bit controlling said each additional switch.

11. The clock source of claim 10, wherein the NMOS devices of the trimming switch array comprise high voltage threshold devices.

12. The clock source of claim 10, further comprising:

a first FET having a source that receives the second charge current and a gate connected to the output of the latch;

a second FET having a source that receives the first charge current; and an inverter connected between a gate of the second FET and the output of the latch.

* * * * *